United States Patent
Park et al.

(10) Patent No.: US 9,610,794 B2
(45) Date of Patent: Apr. 4, 2017

(54) THERMAL TRANSFER FILM, AND ORGANIC ELECTROLUMINESCENT DEVICE PREPARED USING SAME

(71) Applicant: CHEIL INDUSTRIES INC., Gumi-si, Gyeongsangbuk-do (KR)

(72) Inventors: Se Hyun Park, Uiwang-si (KR); Kyoung Ku Kang, Uiwang-si (KR); Jung Hyo Lee, Uiwang-si (KR); Min Hye Kim, Uiwang-si (KR); Sung Han Kim, Uiwang-si (KR); Si Kyun Park, Uiwang-si (KR); Eun Su Lee, Uiwang-si (KR); Seong Heun Cho, Uiwang-si (KR); Jin Hee Choi, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/655,697

(22) PCT Filed: Dec. 26, 2013

(86) PCT No.: PCT/KR2013/012155
§ 371 (c)(1),
(2) Date: Jun. 25, 2015

(87) PCT Pub. No.: WO2014/104735
PCT Pub. Date: Jul. 3, 2014

(65) Prior Publication Data
US 2015/0360496 A1    Dec. 17, 2015

(30) Foreign Application Priority Data
Dec. 27, 2012  (KR) .................. 10-2012-0155619

(51) Int. Cl.
*B41M 5/382* (2006.01)
*B41M 5/46* (2006.01)
(Continued)

(52) U.S. Cl.
CPC .......... *B41M 5/42* (2013.01); *B41M 5/38207* (2013.01); *B41M 5/38214* (2013.01);
(Continued)

(58) Field of Classification Search
CPC .... B41M 5/382; B41M 5/38214; B41M 5/46; B41M 2205/30; B41M 2205/34;
(Continued)

(56) References Cited

U.S. PATENT DOCUMENTS 6,228,555 B1   5/2001   Hoffend, Jr. et al.
2003/0023008 A1   1/2003   Uchida et al.
(Continued)

FOREIGN PATENT DOCUMENTS

CN   1423596 A   6/2003
CN   1627710 A   6/2005
(Continued)

OTHER PUBLICATIONS

International Search Report for PCT/KR2013/012155, dated Apr. 23, 2014, 2 pages.
(Continued)

*Primary Examiner* — Bruce H Hess
(74) *Attorney, Agent, or Firm* — Lewis Roca Rothgerber Christie LLP

(57) ABSTRACT

The present invention relates to a thermal transfer film and to an organic electroluminescent device prepared using same, wherein the thermal transfer film includes a base film
(Continued)

and an outermost layer which is formed on the base film and has 2% or more of a thickness change ratio expressed by formula 1.

22 Claims, 1 Drawing Sheet

(51) Int. Cl.
*H01L 51/00* (2006.01)
*H01L 51/50* (2006.01)
*B41M 5/42* (2006.01)

(52) U.S. Cl.
CPC ..... *H01L 51/0013* (2013.01); *B41M 2205/30* (2013.01); *B41M 2205/34* (2013.01); *B41M 2205/36* (2013.01); *B41M 2205/38* (2013.01); *B41M 2205/40* (2013.01); *H01L 51/5012* (2013.01)

(58) Field of Classification Search
CPC .......... B41M 2205/36; B41M 2205/38; B41M 2205/40; H01L 51/00; H01L 51/0013; H01L 51/50; H01L 51/5012
USPC .......................... 428/32.8, 32.81, 2.87, 32.87
See application file for complete search history.

(56) References Cited

U.S. PATENT DOCUMENTS

| | | |
|---|---|---|
| 2005/0118362 A1 | 6/2005 | Kim et al. |
| 2008/0003519 A1 | 1/2008 | Felder et al. |
| 2009/0081480 A1 | 3/2009 | Takeda et al. |
| 2009/0104557 A1 | 4/2009 | Gao et al. |

FOREIGN PATENT DOCUMENTS

| | | |
|---|---|---|
| CN | 101223826 A | 7/2008 |
| CN | 101836514 A | 9/2010 |
| EP | 0 388 942 A2 | 9/1990 |
| JP | 2003-518454 A | 6/2003 |
| JP | 2008-516823 A | 5/2008 |
| KR | 10-2005-0052303 A | 6/2005 |
| KR | 10-2007-0056847 A | 6/2007 |
| KR | 10-2011-0008790 A | 1/2011 |
| KR | 10-2011-0058176 A | 6/2011 |
| TW | 593542 B | 6/2004 |

OTHER PUBLICATIONS

KIPO Office action dated Apr. 3, 2015 in priority application No. KR 10-2012-0155619, 5 pages.
SIPO Office action dated Mar. 28, 2016, issued in corresponding CN 201380068552.X, 6 pages.
Taiwan Patent Office action dated Dec. 1, 2015, issued in TW application No. 102148407, 7 pages.

THERMAL TRANSFER FILM, AND ORGANIC ELECTROLUMINESCENT DEVICE PREPARED USING SAME

CROSS-REFERENCE TO RELATED APPLICATION(S)

This application is a National Stage of International Application No. PCT/KR2013/012155 filed Dec. 26, 2013, which claims priority to and the benefit of Korean Patent Application No. 10-2012-0155619, filed in the Korean Intellectual Property Office on Dec. 27, 2012, the entire contents of both of which are incorporated herein by reference.

TECHNICAL FIELD

The present invention relates to a thermal transfer film and an organic electroluminescent device prepared using the same.

BACKGROUND ART

A thermal transfer film may be used as a donor film for formation of patterns. The thermal transfer film includes a light-to-heat conversion layer stacked on a base film. A transfer layer including an organic electroluminescent material and the like is stacked on the light-to-heat conversion layer. Moreover, an interlayer may be formed between the light-to-heat conversion layer and the transfer layer.

When the light-to-heat conversion layer is irradiated with light in an absorption wavelength range, the transfer layer can be transferred to a pixel define layer (PDL) and the like by the light-to-heat conversion layer. That is, the light-to-heat conversion layer absorbs light of a specific wavelength, and converts at least part of incident light into heat. Here, the generated heat thermally expands the light-to-heat conversion layer, thereby allowing the transfer layer to be transferred to a PDL of a substrate for OLEDs. However, depending upon thermal expansion of the light-to-heat conversion layer or the interlayer, the transfer layer can be insufficiently transferred in an end portion of the PDL, thereby causing transfer failure.

DISCLOSURE

Technical Problem

It is one aspect of the present invention to provide a thermal transfer film that makes the transfer layer be uniformly transferred.

It is another aspect of the present invention to provide a thermal transfer film that makes the transfer layer be sufficiently transferred in an end portion of the PDL, thereby causing uniform thermal transfer in entire PDL.

Technical Solution

In accordance with one aspect of the present invention, a thermal transfer film may include a base film and an outermost layer formed on the base film, wherein the outermost layer has a thickness change rate of about 0.5% or more, as calculated according to Equation 1:

Thickness change rate (%)=$(T2-T1)/T1 \times 100$,  <Equation 1>

(wherein Equation 1, T1 and T2 are the same as defined in the following detailed description).

In accordance with another aspect of the present invention, an organic electroluminescent device may be prepared using the thermal transfer film as a donor film for laser transfer.

Advantageous Effects

The present invention provides a thermal transfer film, which can make the transfer layer be uniformly transferred.

The present invention provides a thermal transfer film, which makes the transfer layer be sufficiently transferred in an end portion of the PDL, thereby causing uniform thermal transfer in entire PDL.

BEST MODE

Figure 1:
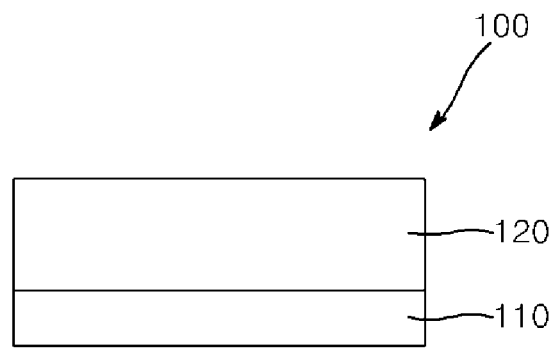
FIG. 1 is a cross-sectional view of a thermal transfer film according to one embodiment of the present invention.

Embodiments of the present invention will now be described in detail with reference to the accompanying drawings. It should be understood that the present invention is not limited to the following embodiments and may be embodied in different ways, and that the embodiments are given to provide thorough understanding of the invention to those skilled in the art. Descriptions of unrelated components will be omitted for clarity. Like components will be denoted by like reference numerals throughout the specification.

As used herein, terms such as 'upper side' and 'lower side' are defined with reference to the accompanying drawings. Thus, it will be understood that the term 'upper side' can be used interchangeably with the term 'lower side'. It will be understood that when an element such as a layer, film, region or substrate is referred to as being placed "on" another element, it can be directly placed on the other element, or an intervening layer(s) may also be present. On the other hand, when an element is referred to as being "directly placed on" another element, an intervening layer(s) is not present. The term '(meth)acrylate' may refer to acrylate and/or methacrylate.

As used herein, the "thickness change rate" may be calculated in the following manner. After an initial thickness (T1) of an outermost layer of a thermal transfer film specimen (size: width×length, 1 cm×1 cm) is measured, thickness change of a thermal transfer film due to increase in temperature from 25° C. to 170° C. is measured while the thermal transfer film specimen is heated at a heating rate of 5° C./min from a starting temperature of 25° C. to a final temperature of 170° C., followed by measuring a maximum thickness (T2) of the outermost layer, thereby calculating a thickness change rate according to Equation 1 below. Here, when the thermal transfer film includes a base film and a light-to-heat conversion layer formed on the base film, the outermost layer is the light-to-heat conversion layer, and when thermal transfer film includes a base film, a light-to-heat conversion layer formed on the base film, and an interlayer formed on the light-to-heat conversion layer, the outermost layer is the interlayer:

Thickness change rate (%)=$(T2 \times T1)/T1 \times 100$  <Equation 1>

According to embodiments of the present invention, a thermal transfer film may include a base film and an outermost layer formed on the base film, wherein the outermost layer may have a thickness change rate of about 0.5% or more, specifically from about 1.0% to about 3.0%, for example about 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9 or 3.0%. If the thickness change rate is less than 0.5%, a transfer layer is not uniformly transferred, and a pixel define layer (PDL), to which the transfer layer should be uniformly transferred, can suffer from tearing, defect, or the like.

The outermost layer may have a coefficient of thermal expansion of about 100 μm/m·°C. or more, preferably from about 100 μm/m·°C. to about 400 μm/m·°C., more preferably from about 200 μm/m·°C. to about 350 μm/m·°C., for example about 200, 210, 220, 230, 240, 250, 260, 270, 280, 290, 300, 310, 320, 330, 340 or 350 μm/m·°C. Within this range, when the transfer layer including an organic light emitting layer and the like is stacked on the outermost layer and thermally transferred, the transfer layer can be uniformly transferred to the PDL without defect or tearing.

The outermost layer may be placed at an uppermost portion in the thermal transfer film, on which the transfer layer such as an organic electroluminescent material and the like is stacked, and allows the transfer layer to be uniformly transferred, particularly, even to an end portion of the PDL.

The outermost layer may be a light-to-heat conversion layer or an interlayer.

Hereinafter, a thermal transfer film according to one embodiment of the present invention will be described in detail with reference to FIG. 1. FIG. 1 is a cross-sectional view of a thermal transfer film according to one embodiment of the present invention.

Referring to FIG. 1, a thermal transfer film 100 according to one embodiment of the invention may include a base film 110 and a light-to-heat conversion layer 120 formed on upper side of the base film 110, wherein the light-to-heat conversion layer 120 may have a thickness change rate of about 0.5% or more, specifically from about 1.0% to about 3.0%, for example about 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9 or 3.0%. Within this range, the transfer layer can be uniformly transferred, and the PDL, to which the transfer layer should be uniformly transferred, can not suffer from tearing, defect, or the like.

The light-to-heat conversion layer 120 may have a coefficient of thermal expansion of about 100 μm/m·°C. or more, specifically from about 100 μm/m·°C. to about 400 μm/m·°C., more specifically from about 200 μm/m·°C. to about 350 μm/m·°C., for example about 200, 210, 220, 230, 240, 250, 260, 270, 280, 290, 300, 310, 320, 330, 340 or 350 μm/m·°C. Within this range, the transfer layer can be uniformly transferred, and the PDL, to which the transfer layer should uniformly be transferred, can not suffer from tearing, defect, or the like.

The base film 110 may exhibit good adhesion to the light-to-heat conversion layer, and can control temperature transfer between the light-to-heat conversion layer and the other layers. The base film 110 may be any transparent polymer film without limitation. In one embodiment, the base film 110 may include at least one of polyesters, polyacrylics, polyepoxys, polyolefins including polyethylenes, polypropylenes and the like, and polystyrenes, without being limited thereto. Preferably, the base film may be a polyester film including polyethylene terephthalate (PET), polyethylene naphthalate films, and the like.

The base film 110 may have a single layer, or multiple layers in which two or more layers are stacked. The base film may have a thickness from about 10 μm to about 500 μm, preferably from about 50 μm to about 250 μm. Within this range, the base film can be used as a base film for the thermal transfer film.

The light-to-heat conversion layer 120 may be formed of a composition for a light-to-heat conversion layer, which includes a UV curable resin, a polyfunctional monomer and a light-to-heat conversion material. The composition may further include an initiator.

The UV curable resin may include at least one of (meth) acrylates, phenols, polyvinylbutyrals, polyvinylacetate, polyvinylacetal, polyvinylidenechloride, cellulose ethers, cellulose esters, nitrocelluloses, polycarbonates, polyalkyl (meth)acrylates including polymethylmethacrylate and the like, epoxy(meth)acrylates, epoxys, urethanes, urethane (meth)acrylates, esters, ethers, alkyd resins, spiroacetals, polybutadienes, polythiolpolyenes, (meth)acrylates of a polyfunctional compound such as polyvalent alcohol and the like, and acrylics, without being limited thereto.

In one embodiment, the UV curable resin may include a copolymer resin including polyalkyl(meth)acrylate resins, (meth)acrylate resins (hereinafter, referred to as the "polyalkyl(meth)acrylate UV curable resin"), and the like.

The polyalkyl(meth)acrylate UV curable resin may have a glass transition temperature of about 110° C. or less, preferably from about 35° C. to about 100° C. or from about 41° C. to about 90° C., more preferably from about 40° C. to about 90° C. Within this range, the light-to-heat conversion layer can have increased thickness change rate and coefficient of thermal expansion, whereby the transfer layer including an organic electroluminescent material and the like can be uniformly transferred to the PDL.

The polyalkyl(meth)acrylate UV curable resin may have a weight average molecular weight (Mw) of about 80,000 g/mol or less, preferably from about 15,000 g/mol to about 70,000 g/mol, more preferably from about 20,000 g/mol to about 50,000 g/mol, still more preferably from about 20,000 g/mol to about 40,000 g/mol. Within this range, the light-to-heat conversion layer can have increased thickness change rate and coefficient of thermal expansion, whereby the transfer layer including an organic electroluminescent material and the like can be uniformly transferred to the PDL.

The polyalkyl(meth)acrylate UV curable resin may be included in an amount of about 5 wt % to about 60 wt %, preferably about 10 wt % to about 50 wt %, more preferably about 30 wt % to about 40 wt %, for example about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 wt % in the light-to-heat conversion layer. Within this range, the light-to-heat conversion layer can exhibit high chemical resistance, and have improved thickness change rate and coefficient of thermal expansion, whereby the transfer layer including an organic electroluminescent material and the like can be uniformly transferred to the PDL.

In another embodiment, the UV curable resin may further include at least one of epoxy(meth)acrylates and urethane (meth)acrylate polymers (for example, oligomers), in addition to the polyalkyl(meth)acrylate UV curable resin. The epoxy(meth)acrylate and the urethane(meth)acrylate polymers may be included in an amount of about 5 wt % to about 60 wt %, preferably about 20 wt % to about 50 wt %, for example 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 wt % in the light-to-heat conversion layer.

In a further embodiment, the UV curable resin may further include at least one of a trifunctional to hexafunctional, (meth)acrylates and ether oligomers, in addition to the epoxy(meth)acrylates and the urethane(meth)acrylate polymers. The at least one of the trifunctional to hexafunctional, (meth)acrylates and ether oligomers may be included in an amount of about 10 wt % to about 60 wt %, for example about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59 or 60 wt % preferably about 20 wt % to about 50 wt % in the light-to-heat conversion layer. Within this range, the light-to-heat conversion layer can exhibit high chemical resistance.

The polyfunctional monomer may be a di- or higher functional, preferably trifunctional to hexafunctional monomer. For example, the polyfunctional monomer may include at least one of polyfunctional (meth)acrylate monomers derived from hydroxyl groups of polyvalent alcohols and fluorine modified polyfunctional (meth)acrylate monomers.

Specifically, the polyfunctional monomer may include at least one selected from polyfunctional (meth)acrylate monomers and fluorine modified polyfunctional (meth)acrylate monomers, without being limited thereto. The polyfunctional (meth)acrylate monomers may be selected from the group consisting of ethylene glycoldi(meth)acrylate, diethyleneglycol di(meth)acrylate, triethyleneglycol di(meth)acrylate, 1,4-butanediol di(meth)acrylate, 1,6-hexanediol di(meth)acrylate, neopentylglycoldi(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, ditrimethylolpropane tetra(meth)acrylate, and propyleneglycol di(meth)acrylate, without being limited thereto. The fluorine modified polyfunctional (meth)acrylate monomers may be prepared by fluorine modification of the polyfunctional (meth)acrylate monomers.

The polyfunctional monomer may be included in an amount of about 10 wt % to about 40 wt %, preferably about 10 wt % to about 25 wt % or about 14 wt % to about 25 wt %, for example about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39 or 40 wt % in the light-to-heat conversion layer. Within this range, the light-to-heat conversion layer can exhibit high chemical resistance, and have improved thickness change rate and coefficient of thermal expansion, whereby the transfer layer including an organic electroluminescent material and the like can be uniformly transferred to the PDL.

The light-to-heat conversion material may include at least one of dyes and pigments which can be typically used in the light-to-heat conversion layer, specifically carbon black, tungsten oxide particles, or the like.

The light-to-heat conversion material may be included in an amount of about 10 wt % to about 50 wt %, preferably about 10 wt % to about 40 wt %, for example about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40 wt % in the light-to-heat conversion layer. Within this range, the light-to-heat conversion layer can exhibit good light-to-heat conversion efficiency, and improve transfer efficiency so that transfer failure can be reduced.

The initiator may include a photo initiator typically used in the art. For example, the initiator may be a benzophenone compound such as 1-hydroxycyclohexyl phenyl ketone, without being limited thereto.

The initiator may be included in an amount of about 0.1 wt % to about 20 wt %, preferably about 1 wt % to about 5 wt % in the light-to-heat conversion layer. Within this range, the light-to-heat conversion layer can exhibit sufficient hardness, and the unreacted initiator may not remain as an impurity.

The light-to-heat conversion layer may be formed of a composition for a light-to-heat conversion layer including the UV curable resin, the polyfunctional monomer, the light-to-heat conversion material and the initiator. The composition may further include a solvent. The solvent serves to form a preparation solution for the light-to-heat conversion material, the UV curable resin and the like. The solvent may be any solvent without limitation. Preferably, the solvent may be methylethylketone, propyleneglycolmonomethylether acetate, or the like.

The composition for a light-to-heat conversion layer may be prepared by a typical method, and may be prepared by adding the initiator to a mixture of the UV curable resin and the polyfunctional monomer, followed by adding and the light-to-heat conversion material and mixing the components.

The composition for a light-to-heat conversion layer may include about 60 wt % to about 80 wt % of the UV curable resin(for example, the total amount of polyalkyl(meth)acrylates, a trifunctional to hexafunctional epoxy(meth)acrylates and urethane(meth)acrylates), about 10 wt % to about 25 wt % of the polyfunctional monomer, about 10 wt % to about 40 wt % of the light-to-heat conversion material, and about 1 wt % to about 5 wt % of the initiator in terms of solid content. Preferably, the composition may include about 60 wt % to about 80 wt % of the UV curable resin, about 14 wt % to about 25 wt % of the polyfunctional monomer, about 10 wt % to about 30 wt % of the light-to-heat conversion material, and about 1 wt % to about 5 wt % of the initiator. In addition, the composition may include about 60 wt % to about 70 wt % of the UV curable resin, about 14 wt % to about 25 wt % of the polyfunctional monomer, about 10 wt % to about 20 wt % of the light-to-heat conversion material, and about 1 wt % to about 5 wt % of the initiator.

The thermal transfer film may be prepared by any typical method. For example, the composition for a light-to-heat conversion layer is coated onto one surface of the base film and then dried, followed by curing the composition through UV irradiation at about 300 mJ/cm$^2$ to about 600 mJ/cm$^2$ in a nitrogen atmosphere, thereby preparing a thermal transfer film.

The light-to-heat conversion layer has a thickness from about 1 μm to about 10 μm, preferably from about 2 μm to about 4 μm. Within this range, the light-to-heat conversion layer can be used as a light-to-heat conversion layer of the thermal transfer film.

Figure 2:
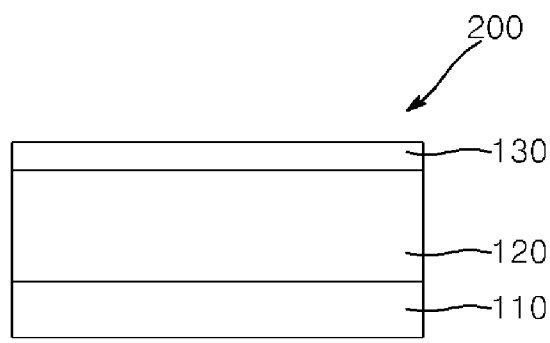
FIG. 2 is a cross-sectional view of a thermal transfer film according to another embodiment of the present invention.

Hereinafter, a thermal transfer film according to another embodiment of the present invention will be described in detail with reference to FIG. 2. FIG. 2 is a cross-sectional view of a thermal transfer film according to another embodiment of the present invention.

Referring to FIG. 2, a thermal transfer film 200 according to another embodiment may include a base film 110, a light-to-heat conversion layer 120 formed on upper side of the base film 110 and an interlayer 130 formed on upper side of the light-to-heat conversion layer 120. The thermal transfer film 200 is the same as the thermal transfer film 100 according to the above embodiment except that the interlayer 130 is further formed on upper side of the light-to-heat conversion layer 120. Thus, only the interlayer will be described in detail hereinafter.

The interlayer 130 may be an outermost layer of the thermal transfer film 200, and may have a thickness change rate of about 0.5% or more, specifically from about 1.0% to about 3.0%, as calculated according to Equation 1 above. Within this range, the transfer layer can be uniformly transferred, and the PDL, to which the transfer layer should be uniformly transferred, may not suffer from tearing, defect, or the like. The interlayer 130 may have a coefficient of thermal expansion of about 100 μm/m·° C. or more, specifically from about 100 μm/m·° C. to about 400 μm/m·° C., more specifically from about 200 μm/m·° C. to about 350 μm/m·° C., for example 200, 210, 220, 230, 240, 250, 260, 270, 280, 290, 300, 310, 320, 330, 340, 350 μm/m·° C. Within this range, the transfer layer can be uniformly transferred, and the PDL, to which the transfer layer should be uniformly transferred, may not suffer from tearing, defect, or the like.

The interlayer may be formed of a composition for an interlayer, which may include a UV curable resin and a polyfunctional monomer. The composition may further include an initiator.

The UV curable resin may include at least one of (meth)acrylates, phenols, polyvinylbutyrals, polyvinylacetate, polyvinylacetal, polyvinylidenechloride, cellulose ethers, cellulose esters, nitrocelluloses, polycarbonates, polyalkyl (meth)acrylates including polymethylmethacrylate and the like, epoxy(meth)acrylates, epoxys, urethanes, urethane (meth)acrylates, esters, ethers, alkyd resins, spiroacetals, polybutadienes, polythiolpolyenes, (meth)acrylate resins of a polyfunctional compound such as polyvalent alcohol and the like, and acrylics, without being limited thereto.

In one embodiment, the UV curable resin may include a copolymer resin including polyalkyl(meth)acrylate resins, (meth)acrylate resins (hereinafter, referred to as the "polyalkyl(meth)acrylate UV curable resin"), and the like.

The polyalkyl(meth)acrylate UV curable resin may have a glass transition temperature (Tg) of about 110° C. or less, preferably from about 35° C. to about 100° C., more preferably from about 40° C. to about 90° C., for example about 40, 50, 60, 70, 80 or 90° C. Within this range, the interlayer, which is the outermost layer, can have increased thickness change rate and coefficient of thermal expansion, whereby the transfer layer including an organic electroluminescent material and the like can be uniformly transferred to the PDL.

The polyalkyl(meth)acrylate UV curable resin may have a weight average molecular weight (Mw) of about 80,000 g/mol or less, preferably from about 15,000 g/mol to about 70,000 g/mol, more preferably from about 20,000 g/mol to about 50,000 g/mol, still more preferably from about 20,000 g/mol to about 40,000 g/mol. Within this range, the interlayer, which is the outermost layer, can have increased thickness change rate and coefficient of thermal expansion, whereby the transfer layer including an organic electroluminescent material and the like can be uniformly transferred to the PDL.

The polyalkyl(meth)acrylate UV curable resin may be included in an amount of about 10 wt % to about 60 wt %, preferably about 20 wt % to about 50 wt %, more preferably about 30 wt % to about 50 wt % for example 30, 31, 32, 33, 34, 35, 36, 37, 38, 39, 40, 41, 42, 43, 44, 45, 46, 47, 48, 49 or 50 wt % in the interlayer. Within this range, the interlayer can exhibit high chemical resistance.

The UV curable resin may further include trifunctional to hexafunctional epoxy(meth)acrylates and urethane(meth) acrylate polymers (for example, oligomers), in addition to the polyalkyl(meth)acrylate UV curable resin. The trifunctional to hexafunctional epoxy(meth)acrylates and the urethane(meth)acrylate polymers may be included in an amount of about 10 wt % to about 60 wt %, preferably about 20 wt % to about 50 wt %, more preferably about 30 wt % to about 50 wt %, for example about 30, 31, 32, 33, 34, 35, 36, 37, 38, 39, 40, 41, 42, 43, 44, 45, 46, 47, 48, 49 or 50 wt % in the interlayer.

The UV curable resin may further include at least one of a trifunctional to hexafunctional, (meth)acrylates and ether oligomers, in addition to the epoxy(meth)acrylates and the urethane(meth)acrylate polymers. The trifunctional to hexafunctional, (meth)acrylates and ether oligomers may be included in an amount of about 10 wt % to about 60 wt %, preferably about 20 wt % to about 50 wt %, for example 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 wt % in the interlayer. Within this range, the interlayer can exhibit high chemical resistance.

The polyfunctional monomer may be a di- or higher functional, preferably trifunctional to hexafunctional monomer. For example, the polyfunctional monomer may be a di- or higher functional monomer derived from hydroxyl groups of polyvalent alcohols, preferably trifunctional to hexafunctional (meth)acrylate monomer.

Specifically, the polyfunctional monomer may include at least one of ethyleneglycol di(meth)acrylate, propyleneglycol di(meth)acrylate, diethyleneglycol di(meth)acrylate, triethyleneglycol di(meth)acrylate, 1,4-butanediol di(meth)acrylate, 1,6-hexanedioldi(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, and ditrimethylolpropane tetra (meth)acrylate, without being limited thereto.

The polyfunctional monomer may be included in an amount of about 10 wt % to about 40 wt %, preferably about 10 wt % to about 35 wt %, more preferably about 14 wt % to about 25 wt %, for example 14, 15, 16, 17, 18, 19, 20, 21, 22, 23, 24, 25 wt % in the interlayer.

The initiator may be a photo initiator typically used in the art. For example, the initiator may be a benzophenone compound such as 1-hydroxycyclohexyl phenyl ketone, without being limited thereto.

The initiator may be included in an amount of about 0.1 wt % to about 20 wt %, preferably about 1 wt % to about 5 wt % in the interlayer. Within this range, the initiator can generate sufficient curing reaction in the interlayer and can be prevented from remaining as residues.

The interlayer may be formed of a composition for an interlayer, which may include about 60 wt % to about 90 wt %, preferably about 60 wt % to about 85 wt % of the UV curable resin (for example, the total amount of polyalkyl (meth)acrylate, trifunctional to hexafunctional epoxy(meth) acrylates and urethane(meth)acrylates); about 10 wt % to about 35 wt %, preferably about 10 wt % to about 25 wt %, preferably about 14 wt % to about 25 wt % of the polyfunctional monomer; and about 1 wt % to about 5 wt % of the initiator in terms of solid content. Within this range, when the transfer layer including an organic electroluminescent material and the like is thermally transferred after being stacked on the interlayer, the transfer layer can be uniformly transferred to the PDL.

The interlayer may further include at least one of a UV curable fluorine compound and a UV curable siloxane compound. The UV curable fluorine compound may be represented by Formula 1, and the UV curable siloxane compound may be a polyether modified dialkyl polysiloxane containing (meth)acrylate group:

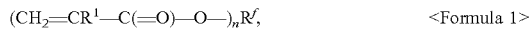
$$(CH_2=CR^1-C(=O)-O-)_n R^f,\qquad \text{<Formula 1>}$$

(wherein Formula 1, n is an integer of 1 or more, $R^1$ is hydrogen or a methyl group, and $R^f$ is a $C_2$ to $C_{50}$ fluoroalkyl group, a $C_2$ to $C_{50}$ perfluoroalkyl group, a $C_2$ to $C_{50}$ fluoroalkylene group or a $C_2$ to $C_{50}$ perfluoroalkylene group).

Specifically, n may be an integer from 2 to 5, and $R^f$ may be a $C_2$ to $C_{15}$ fluoroalkyl group, a $C_2$ to $C_{15}$ perfluoroalkyl group, a $C_2$ to $C_{15}$ fluoroalkylene group or a $C_2$ to $C_{15}$ perfluoroalkylene group.

The composition for the interlayer may further include a solvent. The solvent may include methylethylketone, propyleneglycolmonomethyletheracetate, and the like, without being limited thereto.

The interlayer may have a thickness from about 1 μm to about 10 μm, preferably from about 2 μm to about 5 μm. Within this range, the interlayer can be used as an interlayer for the thermal transfer film.

Details of the light-to-heat conversion layer are the same as described above.

The light-to-heat conversion layer may have a thickness change rate of about 0.5% or more, or about 5% or less, preferably from about 1% to about 3%, and a coefficient of thermal expansion of about 100 μm/m·° C. or more, or about 400 μm/m·° C. or less, preferably from about 200 μm/m·° C. to about 350 μm/m·° C.

The thermal transfer film according to the embodiments of the invention may be used as a donor film for OLEDs and for laser transfer, without being limited thereto. When the thermal transfer film is used as a donor film for laser transfer in an organic electroluminescent device formed of an organic material, the thermal transfer film may not suffer from transfer failure.

According to embodiments of the invention, the thermal transfer film may have a transfer layer stacked on the light-to-heat conversion layer or interlayer, which is the outermost layer in the thermal transfer film.

The transfer layer may include a transfer material, such as organic electroluminescent (EL) materials and the like. When the transfer layer is irradiated with a laser beam at a specific wavelength while adjoining a receptor having a specific pattern, the light-to-heat conversion layer expands to generate heat through absorption of light, whereby the transfer material of the transfer layer is thermally transferred to the receptor corresponding to the pattern.

The transfer layer may include at least one layer to transfer the transfer material to the receptor. The at least one layer may be formed of organic, inorganic, organometallic and other materials, which include electroluminescent or electrically active materials.

The transfer layer may be uniformly coated by evaporation, sputtering or solvent coating, or may be printed as a pattern by digital printing, lithography or evaporation, or sputtering through a mask, to be formed on the light-to-heat conversion layer.

In accordance with another aspect of the present invention, an organic electroluminescent device (including an OLED) may be prepared using the thermal transfer film. Specifically, a donor film is disposed on a substrate on which a transparent electrode layer is formed. The donor film is a film in which the base layer, the light-to-heat conversion layer and the transfer layer are stacked, as described above. The donor film is irradiated with an energy source. The energy source passes through the base layer via a transfer apparatus to activate the light-to-heat conversion layer, which in turn emits heat through pyrolysis. The transfer layer is separated from the donor film due to expansion of the light-to-heat conversion layer in the donor film by the emitted heat, whereby a light emitting layer, which is the transfer material, is transferred to a desired thickness and pattern onto a pixel domain defined by a pixel defining layer on a substrate of the organic electroluminescent device.

MODE FOR INVENTION

Hereinafter, the present invention will be described in more detail with reference to some examples. However, it should be noted that these examples are provided for illustration only and are not to be construed in any way as limiting the present invention.

Preparative Example 1

40 g of polymethylmethacrylate (Elvacite4080, Lucite Co., Ltd., glass transition temperature: 75° C., Mw: 33,000 g/mol) as a UV curable resin, 25 g of an acrylate oligomer (CN120, Sartomer Co., Ltd.) as a UV curable resin, 15 g of a trifunctional acrylate monomer (SR351, Sartomer Co., Ltd.) as a polyfunctional monomer, and 3 g of Irgacure 184 (BASF Co., Ltd.) as a photo initiator were added to a solvent mixture of 70.15 g of methylethylketone and 39.05 g of propyleneglycolmonomethylether acetate, followed by stirring for 30 minutes. 20 g of carbon black was added to the obtained mixture, followed by stirring the resulting material for 30 minutes, thereby preparing a composition for a light-to-heat conversion layer.

Preparative Example 2

40 g of polymethylmethacrylate (Elvacite4104, Lucite Co., Ltd., glass transition temperature: 40° C., Mw: 135,000 g/mol) as a UV curable resin, 25 g of an acrylate oligomer (CN120, Sartomer Co., Ltd.) as a UV curable resin, 15 g of a trifunctional acrylate monomer (SR351, Sartomer Co., Ltd.) as a polyfunctional monomer, and 3 g of Irgacure 184 (BASF Co., Ltd.) as a photo initiator were added to a solvent mixture of 70.15 g of methylethylketone and 39.05 g of propyleneglycolmonomethylether acetate, followed by stirring for 30 minutes. 20 g of carbon black was added to the obtained mixture, followed by stirring the resulting material for 30 minutes, thereby preparing a composition for a light-to-heat conversion layer.

Preparative Example 3

10 g of polymethylmethacrylate (Elvacite4026, Lucite Co., Ltd., glass transition temperature: 75° C., Mw: 32,500 g/mol) as a UV curable resin, 10 g of a urethane acrylate oligomer (CN9006, Sartomer Co., Ltd.) as a UV curable resin, and 3 g of a trifunctional acrylate monomer (SR351, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 184 (BASF Co., Ltd.) as a photopolymerization initiator was added to the obtained mixture, followed by stirring the resulting material for 30 minutes, thereby preparing a composition for an interlayer.

Preparative Example 4

10 g of polymethylmethacrylate (Elvacite4059, Lucite Co., Ltd., glass transition temperature: 40° C., Mw: 20,500 g/mol) as a UV curable resin, 10 g of a urethane acrylate oligomer (CN965, Sartomer Co., Ltd.) as a UV curable resin, and 3 g of a trifunctional acrylate monomer (SR351, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 369 (BASF Co., Ltd.) as a photo initiator was added to the obtained mixture, followed by stirring the resulting material for 30 minutes, thereby preparing a composition for an interlayer.

Preparative Example 5

10 g of polymethylmethacrylate (Elvacite2013, Lucite Co., Ltd., glass transition temperature: 76° C., Mw: 34,000 g/mol) as a UV curable resin, 10 g of a urethane acrylate oligomer (CN964, Sartomer Co., Ltd.) as a UV curable resin, and 3 g of a trifunctional acrylate monomer (SR351, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 369 (BASF Co., Ltd.) as a photo initiator was added to the obtained mixture, followed by stirring the resulting material for 30 minutes, thereby preparing a composition for an interlayer.

Preparative Example 6

10 g of polymethyl methacrylate (Elvacite2045, Lucite Co., Ltd., glass transition temperature: 50° C., Mw: 193,000 g/mol) as a UV curable resin, 10 g of a urethane acrylate oligomer (CN964, Sartomer Co., Ltd.) as a UV curable resin, and 3 g of a trifunctional acrylate monomer (SR351, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 369 (BASF Co., Ltd.) as a photo initiator was added to the obtained mixture, followed by stirring the resulting material for 30 minutes, thereby preparing a composition for an interlayer.

Preparative Example 7

10 g of polymethyl methacrylate (Elvacite2042, Lucite Co., Ltd., glass transition temperature: 65° C., Mw: 142,000 g/mol) as a UV curable resin, 10 g of a urethane acrylate oligomer (CN964, Sartomer Co., Ltd.) as a UV curable resin, and 3 g of a trifunctional acrylate monomer (SR351, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 369 (BASF Co., Ltd.) as a photo initiator was added to the obtained mixture, followed by stirring the resulting material for 30 minutes, thereby preparing a composition for an interlayer.

Preparative Example 8

20 g of an epoxy acrylate binder oligomer (CN120, Sartomer Co., Ltd.) as a curable resin, and 3 g of a trifunctional acrylate monomer (SR499, Sartomer Co., Ltd.) as a polyfunctional monomer were added to a solvent mixture of 50.05 g of methylethylketone and 39.05 g of propyleneglycolmonomethyletheracetate, followed by stirring for 30 minutes. 0.75 g of Irgacure 184 (BASF Co., Ltd.) as a photo initiator was added to the obtained mixture, followed by stirring the resulting material for 30 minutes, thereby preparing a composition for an interlayer.

Example 1

The composition for a light-to-heat conversion layer of Preparative Example 1 was bar-coated onto a polyethyleneterephthalate (PET) film (A4100, Toyobo Co., Ltd., thickness: 100 μm), which is a base film, followed by drying at 80° C. for 2 minutes. The composition was cured at an intensity of 300 mJ/cm$^2$ in a nitrogen atmosphere, thereby forming a light-to-heat conversion layer having an OD of 1.2 and a thickness of 3 μm.

Comparative Example 1

A light-to-heat conversion layer was formed in the same manner as in Example 1 except that the composition for a light-to-heat conversion layer of Preparative Example 2 was used instead of that of Preparative Example 1.

Examples 2 to 4 and Comparative Examples 2 to 4

The composition for a light-to-heat conversion layer of Preparative Example 1 was bar-coated onto a polyethyleneterephthalate (PET) film (A4100, Toyobo Co., Ltd., thickness: 100 μm) as a base film, followed by drying at 80° C. for 2 minutes. The coating layer of the composition was cured at an intensity of 300 mJ/cm$^2$, thereby forming a light-to-heat conversion layer having an OD of 1.2 and a thickness of 3 μm.

Each of the compositions for an interlayer as listed in Table 1 was bar-coated onto the light-to-heat conversion layer, followed by drying in an oven of 80° C. for 2 minutes. The composition was cured at an intensity of 300 mJ/cm$^2$ in a nitrogen atmosphere, thereby preparing a thermal transfer film including a 3.0 μm thick interlayer. A green light emitting layer of Alq3(Tris(8-hydroxyquinolinato)aluminium) was deposited to a thickness of 1200 Å on the interlayer using thermal deposition. Then, the prepared thermal transfer donor film was transferred using a ND:YAG 1064 nm laser of a LITI process at an energy of 70 W to 130 W.

The thermal transfer films prepared in Examples and Comparative Examples were evaluated as to thickness change rate and coefficient of thermal expansion of the outermost layer, transfer width, and transfer line failure rate. In addition, the coefficient of thermal expansion of the interlayer was measured on the thermal transfer films including the interlayer.

(1) Thickness change rate of outermost layer (%): An initial thickness (T1) of the outermost layer of the thermal transfer film (specimen size: width×length, 1 cm×1 cm) was measured using an analyzer for expansion measurement (Q400 model, TA Instrument Co., Ltd.). While the thermal transfer film was heated at a heating rate of 5° C./min from a starting temperature of 25° C. to a final temperature of 170° C., thickness change of the thermal transfer film due to increase in temperature from 25° C. to 170° C. was measured, followed by measuring a maximum thickness (T2) of the outermost layer. Thickness change rate was calculated by Equation 1:

Thickness change rate (%)=(T2−T1)/T1×100    [Equation 1]

Here, the outermost layer means the light-to-heat conversion layer in Example 1 and Comparative Example 1, and the interlayer in Examples 2 to 4 and Comparative Examples 2 to 4.

(2) Transfer width (μm): Transfer width was measured using an optical microscope (Eclips L150, Nikon CO., Ltd.) after focusing on a transfer layer of a receptor.

(3) Transfer line failure rate (%): Transfer line failure rate was calculated by (Failed length)/(Total length of transferred image)×100.

(4) Coefficient of thermal expansion (CTE, μm/m·° C.): A sample was prepared using the composition of the outermost layer used in the preparation of the thermal transfer film. A CTE value was measured using a thermo mechanical analyzer (TMA). After being stabilized at 25° C., the sample was heated at a rate of 5° C./min from 25° C. to 170° C., followed by measuring a CTE value of the outermost layer. The outermost layer means the light-to-heat conversion layer in Example 1 and Comparative Example 1, and the interlayer in Examples 2 to 4 and Comparative Examples 2 to 4.

TABLE 1

|  | Example 1 | Comparative Example 1 | Example 2 | Example 3 | Example 4 | Comparative Example 2 | Comparative Example 3 | Comparative Example 4 |
|---|---|---|---|---|---|---|---|---|
| Composition of light-to-heat conversion layer | Preparative Example 1 | Preparative Example 2 | Preparative Example 1 | Preparative Example 1 | Preparative Example 1 | Preparative Example 1 | Preparative Example 1 | Preparative Example 1 |
| Composition of interlayer | X | X | Preparative Example 3 | Preparative Example 4 | Preparative Example 5 | Preparative Example 6 | Preparative Example 7 | Preparative Example 8 |
| Thickness change rate of light-to-heat conversion layer (%) | 2.1 | 0.2 | — | — | — | — | — | — |
| Thickness change rate of interlayer (%) | — | — | 2.3 | 2.5 | 2.0 | 0.2 | 0.3 | −1.2 |
| Transfer width (μm) | — | — | 28 | 29 | 27 | 12 | 9 | 1 |
| Transfer line failure rate (%) | — | — | 2 | 1 | 0.5 | 78 | 84 | 99 |
| Coefficient of thermal expansion, CTE (μm/m · ° C.) | 240 | 58 | 250 | 280 | 302 | 54 | 62 | −185 |

As shown in Table 1, it can be seen that the thermal transfer films according to the invention exhibited a wide transfer width and a low transfer line failure rate, and thus allowed the transfer layer to be uniformly transferred to a target. In addition, since the thermal transfer films according to the invention could be uniformly thermally transferred even to an end portion of a PDL, the thermal transfer films could be uniformly thermally transferred to the overall PDL.

Conversely, the thermal transfer films of Comparative Examples 1 to 4, which had a thickness change rate of the outermost layer out of the range of the present invention, exhibited a high transfer line failure rate and a narrow transfer width.

Although the present invention has been described with reference to some embodiments in conjunction with the accompanying drawings, it should be understood that the foregoing embodiments are provided for illustrative purposes only and are not to be in any way construed as limiting the present invention, and that various modifications, changes, alterations, and equivalent embodiments can be made by those skilled in the art without departing from the spirit and scope of the invention.

The invention claimed is:

1. A thermal transfer film comprising:
a base film; and
an outermost layer formed on the base film,
wherein the outermost layer has a thickness change rate of about 0.5% or more, as calculated according to Equation 1:

Thickness change rate (%)=($T2-T1$)/$T1$×100,   <Equation 1>

(wherein Equation 1, $T1$ is an initial thickness of the outermost layer,
$T2$ is a maximum thickness of the outermost layer, as measured within a temperature range from 25° C. to 170° C. while the thermal transfer film is heated at a heating rate of 5° C./min from a starting temperature of 25° C. to a final temperature of 170° C.).

2. The thermal transfer film according to claim 1, wherein the outermost layer is a light-to-heat conversion layer, and the thermal transfer film comprises the base film and the light-to-heat conversion layer formed on the base film.

3. The thermal transfer film according to claim 2, wherein the light-to-heat conversion layer has a coefficient of thermal expansion of about 100 μm/m·° C. or more, as measured after the light-to-heat conversion layer is heated at a heating rate of 5° C./min from a starting temperature of 25° C. to a final temperature of 170° C.

4. The thermal transfer film according to claim 2, wherein the light-to-heat conversion layer comprises a cured product of a composition, the composition comprising a polyalkyl (meth)acrylate or (meth)acrylate resin, having a weight average molecular weight from about 15,000 g/mol to about 70,000 g/mol.

5. The thermal transfer film according to claim 4, wherein the polyalkyl (meth)acrylate or (meth)acrylate resin has a glass transition temperature (Tg) from about 35° C. to about 100° C.

6. The thermal transfer film according to claim 4, wherein the composition further comprises a UV curable resin, a polyfunctional monomer, a light-to-heat conversion material, and an initiator.

7. The thermal transfer film according to claim 6, wherein the light-to-heat conversion material comprises at least one of carbon black and tungsten oxide particles.

8. The thermal transfer film according to claim 1, comprising the base film, a light-to-heat conversion layer, and the outermost layer sequentially stacked thereon in this order.

9. The thermal transfer film according to claim 8, wherein the outermost layer has a coefficient of thermal expansion of about 100 µm/m·° C. or more, as measured after the outermost layer is heated at a heating rate of 5° C./min from a starting temperature of 25° C. to a final temperature of 170° C.

10. The thermal transfer film according to claim 8, wherein the outermost layer comprises a cured product of a composition, the composition comprising a polyalkyl (meth)acrylate or (meth)acrylate resin, having a weight average molecular weight (Mw) from about 15,000 g/mol to about 70,000 g/mol.

11. The thermal transfer film according to claim 10, wherein the polyalkyl (meth)acrylate or (meth)acrylate resin has a glass transition temperature from about 35° C. to about 100° C.

12. The thermal transfer film according to claim 10, wherein the polyalkyl (meth)acrylate or (meth)acrylate resin is included in an amount of about 30 wt % to about 50 wt % in the composition in terms of solid content.

13. The thermal transfer film according to claim 10, wherein the composition further comprises a UV curable resin, a polyfunctional monomer and an initiator.

14. The thermal transfer film according to claim 13, wherein the UV curable resin comprises at least one of trifunctional to hexafunctional epoxy (meth)acrylates and urethane (meth)acrylates.

15. The thermal transfer film according to claim 14, wherein the at least one of trifunctional to hexafunctional epoxy (meth)acrylates and urethane (meth)acrylates is included in an amount of about 30 wt % to about 50 wt % in the composition in terms of solid content.

16. The thermal transfer film according to claim 13, wherein the composition comprises about 60 wt % to about 90 wt % of total of the polyalkyl (meth)acrylate or (meth)acrylate resin and the UV curable resin, about 10 wt % to about 25 wt % of the polyfunctional monomer, and about 1 wt % to about 5 wt % of the initiator in terms of solid content.

17. The thermal transfer film according to claim 13, wherein the composition further comprises at least one of a UV curable fluorine compound and a UV curable siloxane compound.

18. The thermal transfer film according to claim 8, wherein the outermost layer has a thickness from about 1 µm to about 10 µm.

19. The thermal transfer film according to claim 8, wherein the light-to-heat conversion layer comprises at least one of a dye and a pigment.

20. The thermal transfer film according to claim 8, wherein the light-to-heat conversion layer comprises at least one of carbon black and tungsten oxide particles.

21. The thermal transfer film according to claim 1, wherein the base film comprises at least one of polyesters, polyacrylics, polyepoxys, polyethylenes, polypropylenes, and polystyrenes.

22. An organic electroluminescent device comprising, a pixel definition layer prepared using the thermal transfer film according to claim 1 as a donor film.

* * * * *